United States Patent [19]

Brody

[11] 4,101,975

[45] Jul. 18, 1978

[54] OPTICAL MEMORY WITH STORAGE IN THREE DIMENSIONS

[75] Inventor: Philip S. Brody, Brookmont, Md.

[73] Assignee: The United States of America as represented by the Secretary of the Army, Washington, D.C.

[21] Appl. No.: 824,895

[22] Filed: Aug. 15, 1977

Related U.S. Application Data

[63] Continuation-in-part of Ser. No. 533,365, Dec. 16, 1974, Pat. No. 4,051,465, which is a continuation-in-part of Ser. No. 411,853, Nov. 1, 1973, Pat. No. 3,855,004.

[51] Int. Cl.² .............................................. G11C 11/42
[52] U.S. Cl. ..................................... 365/117; 365/109; 358/236
[58] Field of Search ................. 365/109, 117; 358/236

[56] References Cited

U.S. PATENT DOCUMENTS 3,693,171  9/1972  Asaw ............................. 340/173 LS Primary Examiner—Terrell W. Fears
Attorney, Agent, or Firm—Nathan Edelberg; Robert P. Gibson; Saul Elbaum

[57] ABSTRACT

A high storage capacity, fast access time, photovoltaic ferroelectric memory apparatus including a plurality of memory planes which are stacked in a three dimensional configuration. Each plane is comprised of a photovoltaic ferroelectric layer and a photoconductive layer sandwiched between two electrodes. Writing of information is effected by illuminating a selected $xy$ location on the planes while simultaneously applying a voltage pulse to a selected $z$ plane, and reading is effected by illuminating a selected $xy$ location while connecting a selected $z$ plane to a read amplifier.

12 Claims, 7 Drawing Figures

OPTICAL MEMORY WITH STORAGE IN THREE DIMENSIONS

RIGHTS OF THE GOVERNMENT

The invention described herein may be manufactured, used and licensed by or for the United States Government for governmental purposes without the payment to me of any royalty thereon.

The present application is a continuation-in-part of U.S. patent application Ser. No. 533,365, filed on Dec. 16, 1974, now U.S. Pat. No. 4,051,465 incorporated herein by reference, which is in turn a continuation-in-part of application Ser. No. 411,853 filed Nov. 1, 1973 now U.S. Pat. No. 3,855,004, also incorporated herein by reference.

The present invention is directed to a high storage density, fast access time random access memory having a three dimensional configuration.

As is known, a random access memory is one which permits information to be instantaneously either written into or read out of any selected storage position of the memory. This is in distinction to a serial memory such as magnetic tape, where a selected position can be arrived at only by unreeling the tape to the desired position. While memories such as magnetic tapes are capable of storage large amounts of information, the serial mode of access is much too slow to be directly useful in the real time operations which are performed by a computer.

Presently, the most widely used random access memory is the magnetic core memory wherein storage is in a row and column arrangement of magnetic cores which are accessed by a matrix arrangement of wires. While the magnetic core memory has found wide usage in computer technology, it is limited both as to storage capacity and rapidity of accessing time. Therefore, in recent years, a great deal of expense and energy has gone into attempting to develop a better random access memory, that is, one with a very large storage capacity, and a very fast accessing time. While memories which have a larger storage capacity than magnetic core memories have been developed, at least some of these have the disadvantage of being volatile, that is, the stored data is lost if the power to the memory or to the computer is cut off.

It is therefore an object of the invention to provide a random access memory having a high density storage capability.

It is a further object of the invention to provide a random access memory having a fast accessing time.

It is still a further object of the invention to provide a memory which is capable of storing gray scale information.

It is still a further object of the invention to provide a memory which allows data to be transferred in and out at high rates.

It is still a further object of the invention to provide a random access memory which is non-volatile.

It is still a further object of the invention to provide a random access memory which is non-destructive.

The above objects are achieved by providing a memory which utilizes photovoltaic ferroelectric material as the storage medium. For a detailed discussion of the properties of these materials as well as typical materials which can be used, the reader is referred to the above-mentioned patent and patent application. Briefly, photovoltaic ferroelectric materials, which include ferroelectric ceramic materials, if remanently polarized, will produce a voltage output upon being illuminated. The polarity of the voltage output corresponds to the polarity of the remanent polarization, and its magnitude is proportional to the magnitude of the remanent polarization and to the length of the material.

In accordance with the invention, a plurality of two dimensional photovoltaic ferroelectric memory planes are stacked to provide a three dimensional configuration. Each memory plane by itself, provides a high density storage capability, and this capability is increased by orders of magnitude by the three dimensional stacking. Both write in and read out are primarily optical, which allows fast accessing times. And, according to the arrangement disclosed, accessing a plurality of stacked memory planes should not take any longer than accessing a single memory plane, so that increased storage capability is achieved without an increase in the accessing time.

The invention will be better understood by referring to the accompanying drawings in which.

Figure 1:
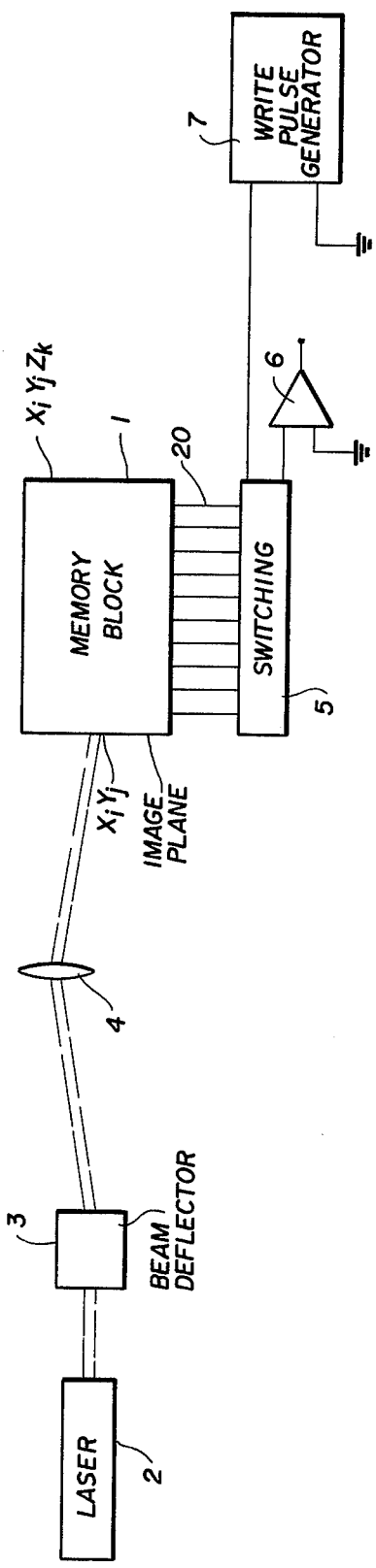
FIG. 1 is a generalized block diagram of the random access memory apparatus of the invention.

FIG. 1 is a block diagram of the general organization of the memory apparatus of the invention. It is comprised of memory block 1 which is a stacked array of photovoltaic ferroelectric layer-photoconductive layer memory planes to be described in greater detail below. Each memory plane is connected to electrical switching network 5 by conductors 20. Beam deflector 3 and lens 4 are disposed with respect to laser 2 so as to deflect the laser beam to any $xy$ memory position of the memory plane.

Generally, in order to write information into the memory cell by cell, the beam is deflected to a selected cell at a position $X_i$, $Y_j$, on the image plane while simultaneously electrical switching network 5 connects the electrodes of a selected memory plane $Z_k$ to write pulse generator 7. Accordingly, the information is recorded into the selected cell $x_i$, $y_j$, $z_k$. Preferably, as will be explained below, the write pulse generator includes a subsidiary pulse generating means for generating an opposite polarity pulse following the write pulse. As will be appreciated, the design of such multiple pulse generators is within the knowledge of those skilled in the art.

To read, the beam is deflected to a selected one of the $N^2$ cells on the image plane while simultaneously electrical switching network 5 connects the conductors from a selected memory plane Z to the read amplifier 6.

It should be understood that both the laser beam deflector system and the electrical switching network 5 are known to those skilled in the art, and form no part of the present invention. Thus, for example, two dimensional beam deflector 3 may comprise a type of electro-optical beam deflector while electrical switching network 5 may comprise a solid state switching array.

Figure 3:
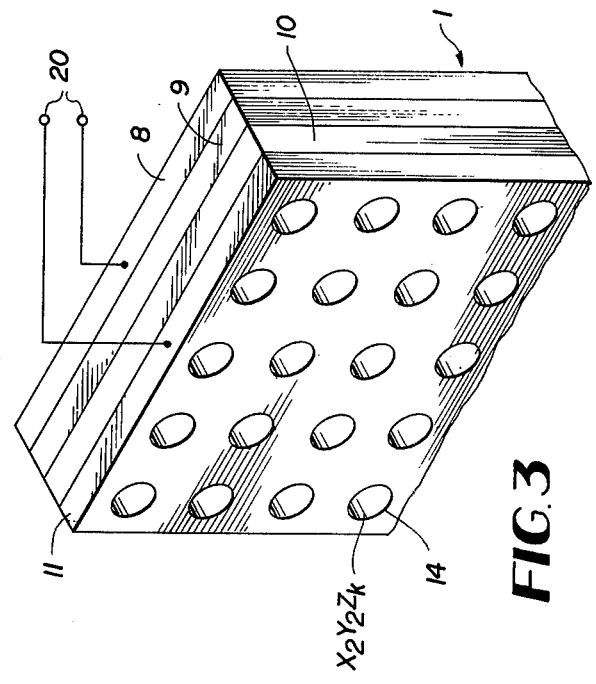
FIG. 3 is a perspective view of a segment of a memory plane.
Figure 2:
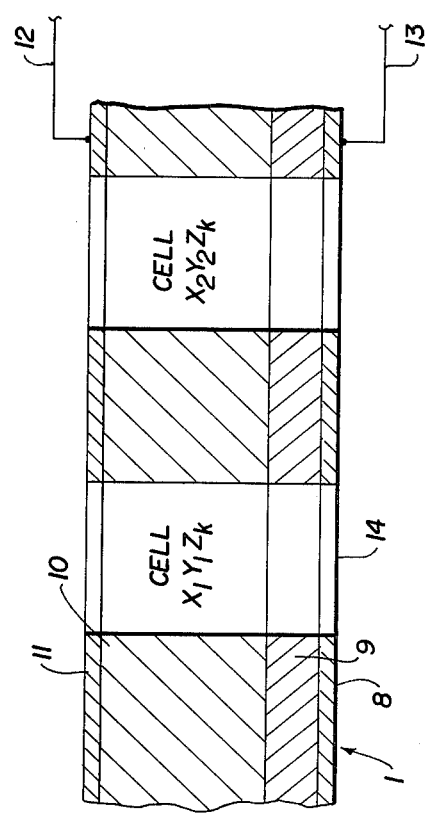
FIG. 2 is a cross-sectional view of a segment of a memory plane.
Figure 4:
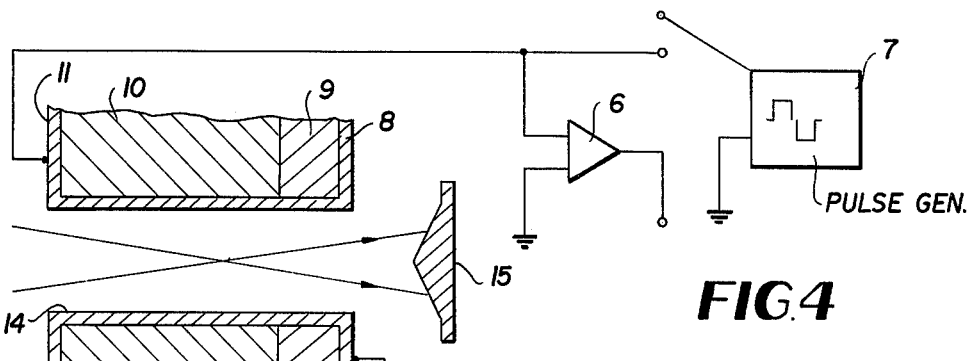
FIG. 4 is a cross-sectional view of a segment of a memory plane in a region of a cavity thereof, and also shows the optical diffuser/reflector block at the end of the cavity.

The structure of memory block 1 is shown in greater detail in FIGS. 2, 3, 4, and FIG. 2 is a cross-sectional view of a segment of a single memory plane while FIG. 3 is a perspective view of a section of the memory plane. As shown, each memory plane is comprised of photovoltaic-ferroelectric layer 9, juxtaposed with photoconductive layer 10, and sandwiched between electrodes 8 and 11. Conductors 20 are attached to the electrodes for connection to electrical switching network 5. The photovoltaic-ferroelectric material may be any of a number of ferroelectric ceramic materials, and for greater detail in this regard, the reader is referred to the above-mentioned patent application and patent. An example of the material which may be used is PZT-5A.

As shown in FIGS. 2 and 3, each of the memory planes is perforated by $N^2$ individual cylindrical hollow cavities. Each of these cavities comprises a memory cell and each is disposed at a different $x$, $xy$ location on the plane.

Photoconductive layer 10 is comprised of a material having a high dark resistance, and preferably a low dielectric constant. Examples are organic photoconductors or zinc oxide prepared with high dark resistance. While the dimensions of the memory plane can be varied to suit individual requirements, as an example, the lateral dimension may be of the order of 1 centimeter, the thickness may be of the order of 0.1mm or less, and the diameter of the individaul cavities may be of the order of 0.025mm.

Each plane described can operate individually as an isolated memory medium as well as a member of a stacked three dimensional configuration. Operation of the stacked configuration will be more easily understood once operation as an isolated unit is described. Referring to FIG. 4, the laser beam is focussed within the cavity which defines the memory cell. The light scatters off the cavity sidewalls and the reflecting-diffusing optical stop 15 which closes the end of the cavity. While not shown in the Figure, the light actually bounces off the sidewalls many times after being reflected back through the cavity by block 15. For even moderate depth to diameter ratios, there will be a light trapping action and the illuminated walls will absorb the light in an optical absorption depth ($\delta$) which will generally be somewhat different for the two different materials which comprise the cavity. Simultaneously with the illumination, a voltage pulse is applied across the electrodes of the memory plane by the pulse generator.

The effect of the illumination in the photoconductive region is to make it conductive relative to its dark conductivity thereby allowing sufficient current to flow through the illuminated wall region to switch a portion of the remanent polarization $P_r$ in the light absorbing region of the photovoltaic-ferroelectric material. The final magnitude and polarity of the polarization is dependent on the magnitude and polarity of the voltage applied, the magnitude of the current that is flowing and the duration of time for which it flows, and the initial state of remanent polarization within that region.

If there was no initial polarization within the region, there is now remanent polarization in the walls of the cavity parallel to the cylindrical axis. There is no remanent polarization in the remaining cavities since simultaneous illumination and application of a voltage has not occured. However, due to the dark current of the photoconductive material, it is possible that under certain conditions, a relatively small switching of remanent polarization will occur in the walls of non-illuminated cavities. Although insignificant during a single write in, after a great number of write ins, this effect can interfere with proper operation.

To minimize this effect after the illumination is removed, a pulse of polarity opposite to that of the initial pulse is applied to the memory plane. This opposite polarity pulse is of sufficient magnitude to remove the small remanent polarization induced in the originally dark cells. The remanent polarization in the cell which was illuminated also may be somewhat reduced in magnitude, but the result of the operation is a net remanent polarization the photovoltaic ferroelectric portion of the cell which was illuminated with essentially zero remanent polarization in the remaining cells. It should be noted that while the ferroelectric material is illuminated in the above-described arrangement, this is not necessary for write in, remanent polarization being effected even if the ferroelectric is not illuminated or is illuminated by a wavelength which does not produce significant photoconductivity in the ferroelectric. To read information out of the memory block, a cavity is illuminated, and the output of the read amplifier is connected across the electrodes. The read illumination induces a current proportional to the magnitude of the remanent polarization which charges the total capacity across the amplifier input. This capacity is primarily the capacity between the memory plane electrodes and it is charged through the low resistance provided by the illuminated photoconductive region of the cylinder wall. The photovoltaic ferroelectric source acts initially as a constant current source charging the capacity C to a voltage $V = (i\delta t)/C$ in time $\delta t$, the voltage appearing across the input of, for example, an FET operational amplifier. The voltage eventually rises to a maximum value equal to the open circuit emf of the photovoltaic-ferroelectric segment which is $V_0 d$, where $V_0$ is the open circuit voltage per unit length, and $d$ is the length of a photovoltaic-ferroelectric cavity. For PZT-5A, the constant, $V_0$ has a value of about 60 millivolts per micrometer.

An essential element of the present invention is the simultaneous accessing for both writing and reading of a plurality of stacked three dimensional planes. This enables accessing of a large number of stacked planes in the same time as it would take to access a single plane. While the cylindrical cavity arrangement described is effected with particular convenience and advantage, the invention is not limited to this embodiment. Further, it should be appreciated that the type of memory disclosed has advantages over systems using various techniques including photoconductive switching to effect remanent polarization for changing the light transmission properties of an element. Such memory does not lend itself to three dimensional stacking because of the resultant superposition and confusion of read information. It should be further note that while not as effective for read-out, instead of the photovoltaic effect produced by illumination, the pyroelectric current produced by selective heating may be used. It may also be possible to use other transient currents which are proportional to the remanent polarization for read out.

The photoconductive region serves two purposes. Firstly, as a photoconductive switch which allows polarizing of selected cells, and secondly, as a contact point which connects the region in which the read signal is generated to the capacitor formed primarily by the plate electrodes. This capacity is much reduced from the capacity of a parallel plate capacitor which would be formed by the plates were they to directly cross the photovoltaic-ferroelectric layer, the dielectric constant of which is of the order of 1,000, since the photovoltaic material typically would have a dielectric constant of about 10. The arrangement thus enhances the magnitude of an initial read signal, as can be seen from the above equation.

Reading can also be accomplished with the use of a current sensing amplifier instead of a voltage sensing amplifier.

With the arrangement shown in the drawings, experimental results indicate that relatively fast read and write times can be obtained. Additionally, by making the cylinders diameters as well as the distances between cylinders relatively small, a high packing density can be obtained. This high packing density can be increased by orders of magnitude by stacking the memory plates to form a three dimensional configuration. Thus, large numbers of plates can be stacked to increase the storage density many times without increasing the read-write access times.

Figure 5:
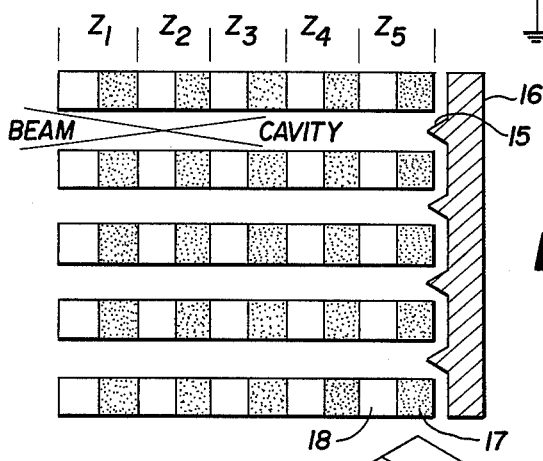
FIG. 5 is a cross-sectional view of a stacked array of memory planes.
Figure 6:
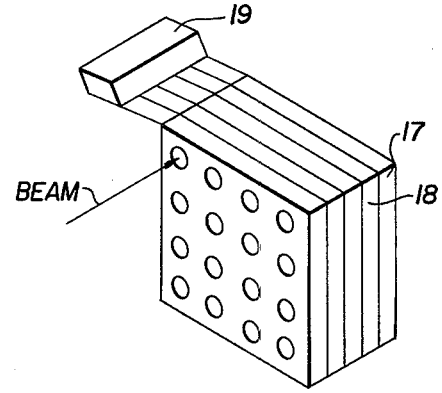
FIG. 6 is a perspective view of a stacked array of memory planes.

The three dimensional configuration is effected by stacking a plurality of plates with the cylindrical cavities in register, and adding a multiple switching circuit which allows a selected sequential pair of electrodes to be selectively connected to the write pulse generator for the write operation and to the read amplifier for the read operation. As shown in cross-section in FIG. 5 and in perspective in FIG. 6, a plurality of memory plates 17, 18, etc. are stacked together with the individual plates being connected to switching network 19. Multiple diffuser-reflector block 16 is disposed at the end of the composite cavities. To write, the beam is deflected to a cell entrance $x, y$. The light which is trapped illuminates the inside of a long hollow cylinder comprised of the individual cylindrical memory cells between the electrodes bounding the planes. Information is stored in any one of the cells, $x_i, y_j, z_k$ by illuminating the cylinder entrance $x_i, y_j$ and switching the electrodes across the plate $z_k$ to the write pulse generator which applies the poling voltage pulse and the subsequent clean-up pulse with the illumination removed. To read, cell $x_i, y_j$ is illuminated, and the electrodes of plane $z_k$ are switched to the amplifier input.

Figure 7:
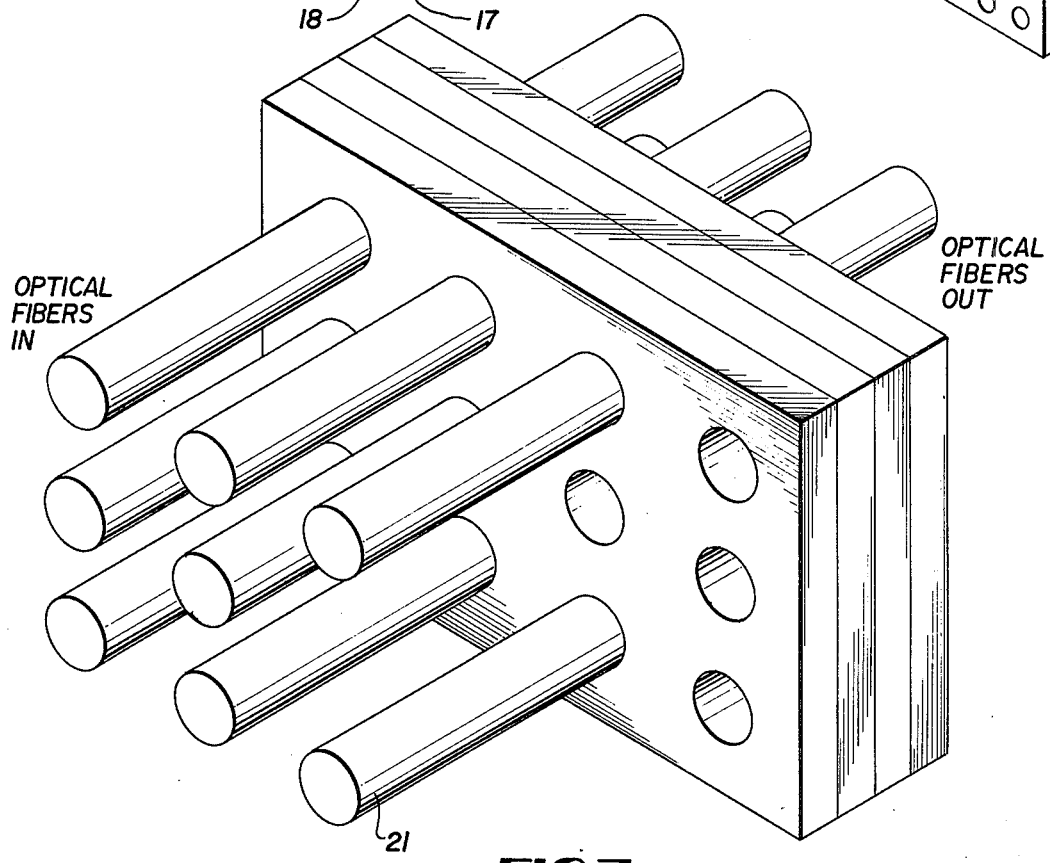
FIG. 7 is a perspective view of a fiber optic image recording station utilizing the principles of the present invention.

Further, it is clear that a continuous tone image which is projected upon the cylinder entrances can be stored in one polarizing operation in any of the stacked plates. It can be removed by electrical de-poling, or by re-poling to a uniform polarization state. As shown in FIG. 7, such an image could enter by way of fiber optic lines 21.

While in the multiple plane system described above, readout is normally point by point with random, or if desired, sequential access for data transfer purposes, higher rates can be achieved by transferring out data in parallel into K read amplifiers simultaneously from K plates. Similarly, K pulse generators can be used for writing in parallel.

Since the output current of an illuminated cell is proportional to both the illumination intensity I and the remanent polarization in the cell $P_r$, the memory can be used to compute the product of these two quantities. An intensity modulated beam can be utilized to produce $\delta(I)$ and where R is the product, $$R = A_o \delta(I) \zeta(P_r)$$

It should be understood that while the Figures show a read-write ferroelectric photovoltaic memory, the teachings of the invention are also applicable to a read only memory in which the photoconductive layer would be dispensed with. The remanent polarization information could be entered by a direct polarization technique, by replication, or by any other method known to those skilled in the art.

I wish it to be understood that I do not desire to be limited to the exact details of construction shown and described, for obvious modifications can be made by a person skilled in the art.

What is claimed is:

1. A three dimensional photovoltaic ferroelectric memory apparatus, comprising,
   a plurality of electrically switchable stacked ferroelectric memory planes,
   each memory plane including a layer of photovoltaic ferroelectric material and a layer of photoconductive material,
   means for generating a light beam,
   means for optically addressing selected storage $x$-$y$ locations of the memory planes with said light beam, and
   means for simultaneously electrically switching to a selected memory plane, whereby the selected $x$-$y$ locations on the selected plane are accessed for writing and/or reading.

2. The apparatus of claim 1 wherein each memory plane further comprises,
   a sandwich of said layer of photovoltaic ferroelectric material and said layer of photoconductive material between two electrodes, and,
   said means for electrically switching being connected to said electrodes.

3. The apparatus of claim 2 wherein said memory planes have a plurality of cavities therein,
   each cavity extending fully through the memory plane and comprising said storage $x$-$y$ location.

4. The apparatus of claim 3 wherein said memory planes are stacked with the cavities of the respective planes being lined up with each other.

5. The apparatus of claim 4 further comprising,
   means for writing information into said memory,
   said means for writing comprising,
   means for applying a first electrical pulse to said selected memory plane, whereby due to the photoconductivity of said photoconductive layer a greater portion of the magnitude of said pulse appears across said selected $x$-$y$ locations than across non-selected locations, thereby inducing a remanent polarization in the ferroelectric of said selected locations.

6. The apparatus of claim 5 further including,
   means for applying a second electrical pulse opposite in polarity to said first electrical pulse immediately following said first electrical pulse, the magnitude of said second pulse being substantially smaller than the magnitude of said first pulse.

7. The apparatus of claim 5 further including,
   means for reading which includes means for connecting said selected memory plane to a read amplification means.

8. The apparatus of claim 5 further including, a light diffuser-reflector means disposed at the end of each composite cavity which is formed by the juxtaposition of the adjacent cavities of the adjacent stacked memory planes.

9. The apparatus of claim 3 for accessing a plurality of cavities at the same time, comprising
a light conducting element disposed to pass in, through, and out of each of said plurality of cavities.

10. A memory apparatus comprising,
a memory plane comprised of a layer of photovoltaic ferroelectric material and a layer of photoconductive material sandwiched between two electrodes,
said plane having a plurality of information storage cavities therein, each cavity passing entirely through said memory plane, and,
means for addressing a selected cavity with a light beam, and,
means for simultaneously applying a voltage pulse across said electrodes, whereby information is written into said selected cavity.

11. A method for determining the product of two quantities, utilizing the apparatus described in claim 7, comprising the steps of,
making the intensity of said light beam proportional to one of said quantities,
making the magnitude or duration of said electrical pulse proportional to the second of said quantities,
optically addressing a selected cavity with said light beam,
applying said pulse to a selected memory plane, and,
detecting the output current of said selected cavity in said selected plane, which current corresponds to said product.

12. A three dimensional photovoltaic ferroelectric memory apparatus, comprising,
a plurality of electrically switchable stacked ferroelectric memory planes,
each memory plane including a layer of photovoltaic ferroelectric material,
means for generating a light beam,
means for optically addressing selected storage $x$-$y$ locations of the memory planes with said light beam, and
means for simultaneously electrically switching to a selected memory plane, whereby the selected $x$-$y$ locations on the selected plane are accessed for reading.

* * * * *